(12) United States Patent
Matsui (10) Patent No.: US 7,031,864 B2
(45) Date of Patent: Apr. 18, 2006

(54) SEMICONDUCTOR DEVICE HAVING A MODE OF FUNCTIONAL TEST

(75) Inventor: Katsuaki Matsui, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 189 days.

(21) Appl. No.: 09/839,671

(22) Filed: Apr. 23, 2001

(65) Prior Publication Data

US 2002/0010559 A1 Jan. 24, 2002

(30) Foreign Application Priority Data

Jul. 18, 2000 (JP) .............................. 2000-216851

(51) Int. Cl.
*G01R 31/28* (2006.01)

(52) U.S. Cl. ................. 702/117; 702/79; 702/120; 702/176; 714/726; 716/6

(58) Field of Classification Search ................ 702/79, 702/89, 117–120, 176–178; 714/724, 726, 714/731, 733, 734; 716/6, 17; 324/532, 324/534

See application file for complete search history.

(56) References Cited

U.S. PATENT DOCUMENTS

| | | | | |
|---|---|---|---|---|
| 4,006,467 A | * | 2/1977 | Bowman | 365/230.02 |
| 4,878,209 A | * | 10/1989 | Bassett et al. | 368/113 |
| 5,198,999 A | * | 3/1993 | Abe et al. | 365/189.05 |
| 5,337,321 A | * | 8/1994 | Ozaki | 714/731 |
| 5,430,394 A | * | 7/1995 | McMinn et al. | 327/292 |
| 5,661,685 A | * | 8/1997 | Lee et al. | 365/185.22 |
| 5,696,771 A | * | 12/1997 | Beausang et al. | 714/726 |
| 5,774,474 A | * | 6/1998 | Narayanan et al. | 714/726 |
| 5,821,786 A | * | 10/1998 | Nozuyama et al. | 327/141 |
| 5,875,114 A | * | 2/1999 | Kagatani et al. | 716/6 |
| 5,923,676 A | * | 7/1999 | Sunter et al. | 714/733 |
| 6,144,262 A | * | 11/2000 | Kingsley | 331/57 |
| 6,189,121 B1 | * | 2/2001 | Ogawa | 714/733 |
| 6,266,749 B1 | * | 7/2001 | Hashimoto et al. | 711/167 |

(Continued)

FOREIGN PATENT DOCUMENTS

JP 61016615 A * 1/1986

(Continued)

OTHER PUBLICATIONS

Oracle ThinkQuest, "Circuit Schematic Symbols". 1997. http://library.thinkquest.org/10784/circuit$_{13}$symbols.html.*

*Primary Examiner*—Marc S. Hoff
*Assistant Examiner*—Jeffrey R West
(74) *Attorney, Agent, or Firm*—Volentine Francos & Whitt, PLLC (57) ABSTRACT

A semiconductor device including a first signal path for guiding an input signal from a first pad to an input terminal of a macro cell; a second signal path for guiding a clock from a second pad to a clock input terminal of the macro cell; a third signal path for guiding an output signal from a signal output terminal of the macro cell to a third pad; and a fourth signal path for receiving the clock from the first signal path and guiding the clock to a fourth pad. It is possible to eliminate wiring delay by measuring the time from when the input signal and the clock are supplied by the first and second pads until the output signal is output by the third pad, and the time from when the clock is supplied to the second path until it is output by the fourth pad.

4 Claims, 5 Drawing Sheets

U.S. PATENT DOCUMENTS

| | | | |
|---|---|---|---|
| 6,272,439 B1 * | 8/2001 | Buer et al. | 702/75 |
| 6,285,229 B1 * | 9/2001 | Chu et al. | 327/277 |
| 6,308,291 B1 * | 10/2001 | Kock et al. | 714/729 |
| 6,327,218 B1 * | 12/2001 | Bosshart | 365/233 |
| 6,393,592 B1 * | 5/2002 | Peeters et al. | 714/731 |
| 6,424,583 B1 * | 7/2002 | Sung et al. | 365/201 |
| 6,434,727 B1 * | 8/2002 | Ishii et al. | 716/6 |
| 6,512,707 B1 * | 1/2003 | Miura et al. | 365/194 |
| 6,578,166 B1 * | 6/2003 | Williams | 714/726 |
| 6,615,380 B1 * | 9/2003 | Kapur et al. | 714/738 |
| 6,774,693 B1 * | 8/2004 | Carr | 327/276 |
| 6,795,931 B1 * | 9/2004 | LaBerge | 327/276 |
| 6,948,106 B1 * | 9/2005 | Porterfield | 714/726 |
| 2002/0015506 A1 * | 2/2002 | Aceti et al. | 381/314 |
| 2003/0048142 A1 * | 3/2003 | Albean | 331/57 |
| 2003/0222693 A1 * | 12/2003 | Cohen et al. | 327/277 |

FOREIGN PATENT DOCUMENTS

| | | | |
|---|---|---|---|
| JP | 61016615 A | * | 1/1986 |
| JP | 02184048 A | * | 7/1990 |
| JP | 09127205 A | * | 5/1997 |
| JP | 2000030492 A | * | 1/2000 |
| JP | 2000030492 A | * | 1/2000 |
| JP | 2002033455 A1 | * | 1/2002 |

* cited by examiner

SEMICONDUCTOR DEVICE HAVING A MODE OF FUNCTIONAL TEST

BACKGROUND OF THE INVENTION

1. Field of the Invention

The present invention relates to a semiconductor device, and more particularly to a semiconductor device which is provided with a mode for performing a functional test of circuit blocks formed in an integrated circuit.

2. Description of Related Art

Known types of integrated circuits in semiconductor devices include those that are a consolidation of a plurality of large-scale macro cells. Macro cells are circuit blocks constituted by combining a plurality of small-scale circuit blocks which have already been individually designed. For example, macro cells are employed as RAM (random access memory) blocks or the like.

In the case of employing macro cells in integrated circuits, a functional test of only this macro cell is sometimes performed in the testing process of the semiconductor device. For this reason, some integrated circuits are provided with circuits for a functional test of macro cells.

In general, a functional test of macro cells comprises the testing of access time and the testing of setup time.

Access time is the required time from when the signal input terminal of the macro cell receives the signal until the signal output terminal outputs the signal. When access time is longer than the designed value, the next stage circuit cannot be caused to operate properly. The signal input terminal inputs the signal at a timing of clock is input (rise timing or fall timing). Consequently, the access time may be measured by measuring the required time from when the clock input terminal receives the clock until the signal output terminal outputs the signal.

Setup time is the allowable time difference from when the signal potential is applied to the signal input terminal until the clock is input to the clock input terminal, and the allowable time difference from when the clock is input to the clock input terminal until the application of the signal potential to the signal input terminal is ended. In order for the macro cell to correctly receive a signal, the time difference from when the signal potential is applied to the signal input terminal until the clock is input to the clock input terminal must be greater than or equal to a prescribed allowable time difference. Likewise, in order for the macro cell to correctly take up a signal, the time difference from when the clock is input to the clock input terminal until the application of the signal potential to the signal input terminal is ended must be greater than or equal to a prescribed allowable time difference. When these allowable time differences are greater than the designed values, there is a risk that a signal of erroneous value will be taken up by the macro cell. For this reason, in the testing of setup time, it is determined whether the signal is read correctly in the case where the time difference of the start/end timing of signal application and clock input timing is a prescribed value. The output signal value is used to determine whether the signal was read correctly.

In conventional semiconductor devices, the required time from when a test signal is input to the input pad of the chip until the output pad of the chip outputs the signal is measured in the case of testing access time. Also, in the case of testing setup time, the value of the output signal is read for when a prescribed value is established for the difference between the start/end time of applying a test signal to the input pad of the chip and the time of the application of the test clock to the clock input pad of the chip.

However, in the case of a long wiring distance between these bonding pads and the macro cells, the wiring delay cannot be ignored and accurate a functional test cannot be performed. In the access time testing discussed above, for example, an accurate determination cannot be made in the case where it is impossible to ignore the wiring delay between the input pad and the signal input terminal of the macro cell and the wiring delay between the signal output terminal of the macro cell and the output pad. Also, in the setup time testing discussed above, an accurate determination cannot be made in the case where it is impossible to ignore the difference between the wiring delay from the input pad to the signal input terminal of the macro cell and the wiring delay from the clock input pad to the clock input terminal of the macro cell.

SUMMARY OF THE INVENTION

It is an object of the present invention to provide a semiconductor device with which the influence of wiring delay can be eliminated and accurate a functional test can be performed.

For this reason, the semiconductor device relating to the present invention comprises: a macro cell to which an input signal is input at the input clock and which outputs an output signal of a value corresponding to the value of the input signal; a first signal path for guiding the test input signal, which has been supplied to a first pad, to the signal input terminal of the macro cell; a second signal path for guiding the test clock, which has been supplied to a second pad, to the clock input terminal of the macro cell; a third signal path for guiding the test output signal output from the signal output terminal of the macro cell to a third pad; and a delay measurement signal path for measuring the wiring delay time of the first, second, and third signal paths.

The present invention can eliminate the influence of the wiring delay of the first, second, or third path because it is provided with a delay measurement signal path for measuring the wiring delay time.

BRIEF DESCRIPTION OF THE DRAWINGS

Other objects and advantages of the present invention will be explained with reference to the appended drawings as follows.

DESCRIPTION OF THE PREFERRED EMBODIMENTS

The preferred embodiments of the present invention are explained below using the drawings. In the drawings, the sizes, forms, and positional relationships of the various constitutional elements are only shown in general so that the invention can be easily understood. Also, the numerical conditions explained below are merely examples to make the invention understandable.

First Embodiment

Figure 1:
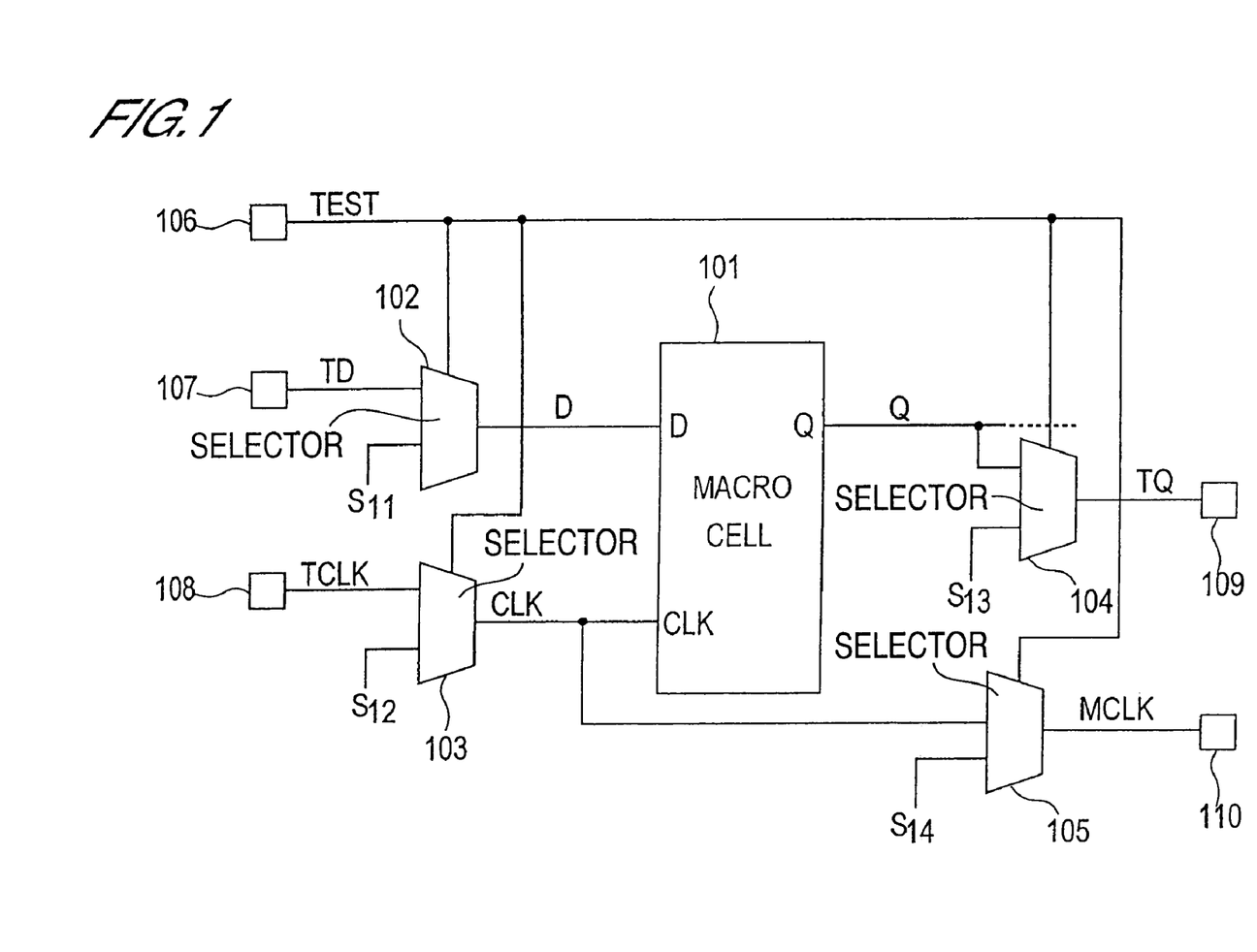
FIG. 1 is a circuit diagram showing the constitution of a semiconductor device relating to a first embodiment.
Figure 2:
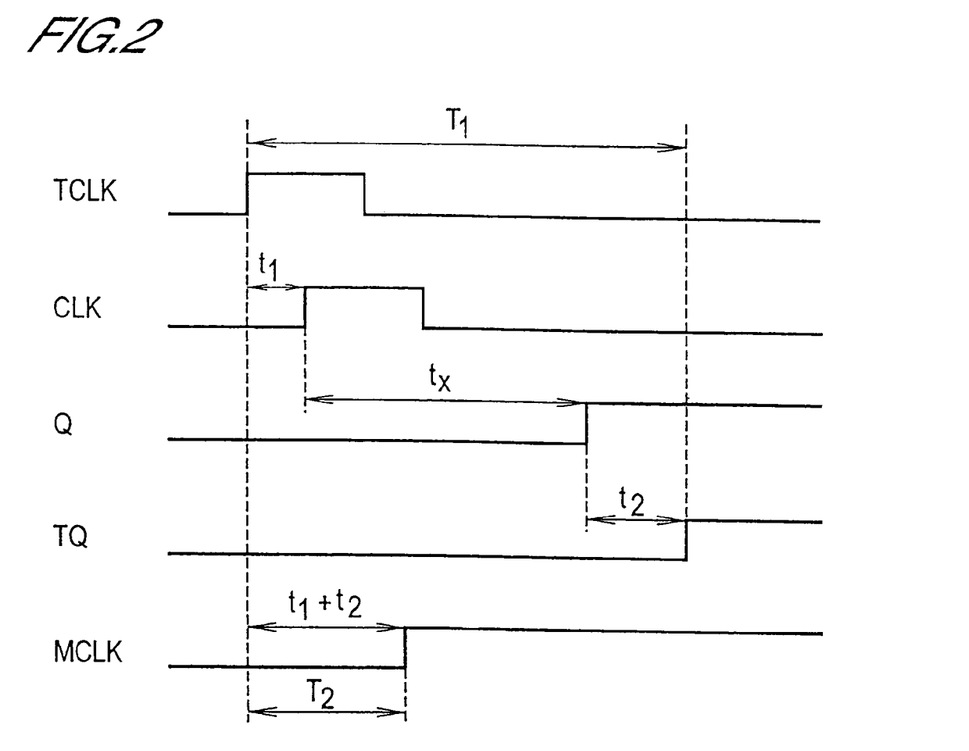
FIG. 2 is a timing chart for explaining the testing method of the semiconductor device relating to the first embodiment.

The first embodiment of the present invention is explained using FIGS. 1 and 2. The present embodiment is an example of the semiconductor device for accurately determining the access time of the macro cell.

FIG. 1 is a circuit diagram showing the principal elements constituting the semiconductor device relating to the present embodiment.

As shown in FIG. 1, this semiconductor device comprises a macro cell 101, two-input multiplexers 102, 103, 104, 105, input pads 106, 107, 108, and output pads 109, 110.

The macro cell 101 constitutes RAM or the like and is provided with a signal input terminal D, a clock input terminal CLK, and a signal output terminal Q. As discussed below, the signal D and clock CLK are input to the signal input terminal D and clock input terminal CLK from the multiplexers 102, 103. Also, the signal output terminal Q supplies the output signal Q to the following circuit block or the like, not shown, and to the multiplexer 104.

The multiplexer 102 is connected to the pad 107 at one input terminal thereof, and receives an output signal S11 from another circuit block or the like (not shown) at the other input terminal. Also, the output terminal of the multiplexer 102 is connected to the signal input terminal D of the macro cell 101. Furthermore, the select signal input terminal of the multiplexer 102 is connected to the pad 106. Here, it will be sufficient if one input terminal of the multiplexer 102 and the pad 107 are connected during a functional test. Consequently, during a normal operation, the pad 107 may also be used as a signal pad for another circuit block (not shown).

The multiplexer 103 is connected to the pad 108 at one input terminal thereof, and receives a clock S12 from another circuit block or the like (not shown) from the other input terminal. Also, the output terminal of the multiplexer 103 is connected to the clock input terminal CLK of the macro cell 101. Furthermore, the select signal input terminal of the multiplexer 103 is connected to the pad 106. Here, it will be sufficient if one input terminal of the multiplexer 103 and the pad 108 are connected during a functional test. Consequently, during a normal operation, the pad 108 may also be used as a signal pad for another circuit block (not shown).

The multiplexer 104 is connected to the signal output terminal Q of the macro cell 101 at one input terminal thereof, and receives the output signal S13 of another circuit block or the like (not shown) from the other input terminal. Also, the output terminal of the multiplexer 104 is connected to the pad 109. Furthermore, the select signal input terminal of the multiplexer 104 is connected to the pad 106. Accordingly, the pad 109 is used as the output pad for the signal Q during a functional test and is used as the output pad for the signal S13 during a normal operation.

The multiplexer 105 is connected to the clock input terminal CLK of the macro cell 101 at one input terminal thereof, and receives, at the other input terminal, the output signal S14 of another circuit block or the like (not shown). Also, the output terminal of the multiplexer 105 is connected to the pad 110. Furthermore, the select signal input terminal of the multiplexer 105 is connected to the pad 106. Accordingly, the pad 110 is used as the output pad for the clock CLK during a functional test operation and is used as the output pad for the signal S14 during a normal operation.

The multiplexer 105 is disposed in the vicinity of the multiplexer 104. In this manner, the length of the wiring from the multiplexer 104 to the pad 109 and the length of the wiring from the multiplexer 105 to the pad 110 can be made substantially the same. Consequently, the difference between the length of the wiring from the signal output terminal Q to the pad 109 and the length of the wiring from the clock input terminal CLK to the pad 110 becomes the difference between the length of the wiring from the signal output terminal Q to the multiplexer 104 and the length of the wiring from the clock input terminal CLK to the multiplexer 105; this difference can be ignored in the wiring delay. Consequently, the delay time until the output signal Q reaches the pad 109 and the delay time until the clock CLK reaches the pad 110 are substantially the same.

The method for measuring the access time of the semiconductor device shown in FIG. 1 is explained next using FIG. 2.

When performing a functional test, the signal TEST supplied to the pad 106 is set to the signal value for the functional test mode. As a result, the multiplexer 102 selects the pad 107, the multiplexer 103 selects the pad 108, the multiplexer 104 selects the signal Q, and the multiplexer 105 selects the clock CLK. Next, the test signal TD is input from the pad 107 and the test clock TCLK is input from the pad 108. The test signal TD and test clock TCLK are input to the macro cell 101 through the multiplexers 102 and 103. The macro cell 101 then reads the test signal TD at the time indicated by the test clock TCLK (rise time in the example in FIG. 2), and outputs the signal Q of a value corresponding to the value of this test signal TD. This signal TQ is output from the pad 109 through the multiplexer 104. Also, the test clock TCLK is output as a clock MCLK from the pad 110 through the multiplexer 105.

In the present embodiment, the required time T1 from when the test clock TCLK is supplied to the pad 108 until the pad 109 outputs the signal TQ and the required time T2 from when the test clock TCLK is supplied to the pad 108 until the pad 110 outputs the test clock MCLK are measured. The difference between these required times T1−T2 is then calculated. As shown in FIG. 2, when the time from when the test clock TCLK is applied to the pad 108 until the test clock TCLK is input to the macro cell 101 is t1; the time from when the macro cell receives the test clock TCLK until the macro cell outputs the signal Q (meaning access time) is tx; and the time from when the signal Q is output until this signal 0 reaches the pad 109 is t2, then the time T1=t1+tx+t2. Also, as discussed above, the wiring delay from the output terminal Q to the pad 109 and wiring delay from the clock input terminal CLK to the pad 110 are substantially the same and therefore the time T2=t1+t2. Consequently, the time difference T1−T2 matches the access time tx. In other words, the time difference T1−T2 is the value obtained by removing the effect of the wiring delay from the measured value of the access time T1.

In this way, this semiconductor device relating to the present embodiment makes possible the accurate measurement of the access time of the macro cell.

Second Embodiment

The second embodiment of the present invention is explained next using FIG. 3. The present embodiment is an example of the semiconductor device for accurately determining the access time of the macro cell.

Figure 3:
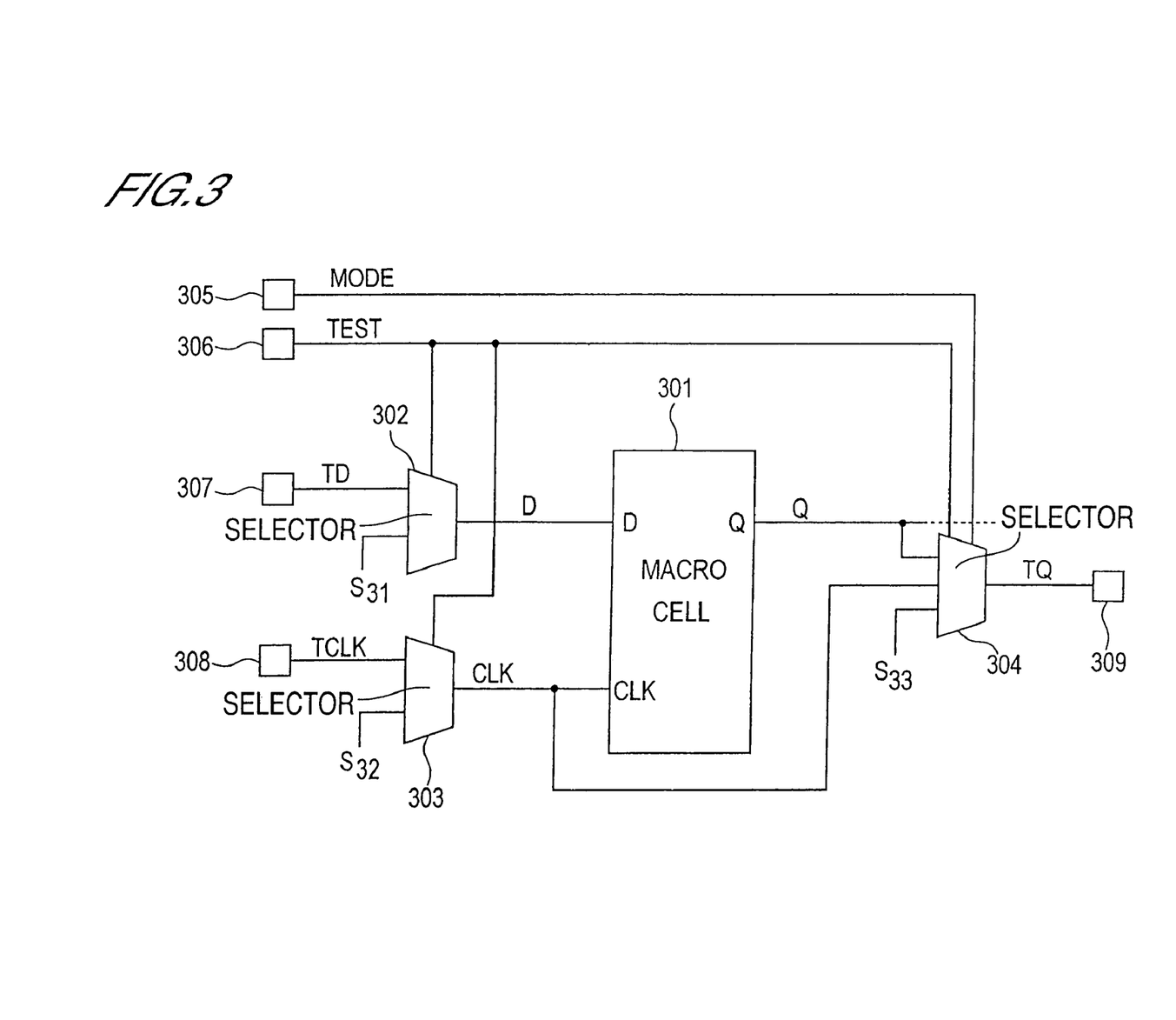
FIG. 3 is a circuit diagram showing the constitution of the semiconductor device relating to a second embodiment.

FIG. 3 is a circuit diagram showing the principal elements constituting the semiconductor device relating to the present embodiment.

As shown in FIG. 3, this semiconductor device comprises a macro cell 301, two-input multiplexers 302, 303, a three-input multiplexer 304, input pads 305, 306, 307, 308, and an output pad 309.

The macro cell 301 constitutes RAM or the like and is provided with a signal input terminal D, a clock input terminal CLK, and a signal output terminal Q. As discussed below, the signal D and clock CLK are input to the signal input terminal D and clock input terminal CLK from the multiplexers 302, 303. Also, the signal output terminal Q supplies the output signal Q to the following circuit block and so forth, not shown, and to the multiplexer 304.

The multiplexer 302 is connected to the pad 307 at one input terminal thereof, and receives the output signal S31 of another circuit block or the like (not shown) at the other input terminal. Also, the output terminal of the multiplexer 302 is connected to the signal input terminal D of the macro cell 301. Furthermore, the select signal input terminal of the multiplexer 302 is connected to the pad 306. Here, one input terminal of the multiplexer 302 and the pad 307 should be connected during a functional test. During a normal operation, therefore, the pad 307 may be used as a signal pad for another circuit block (not shown).

The multiplexer 303 is connected to the pad 308 at one input terminal thereof, and receives the clock S32 of another circuit block or the like (not shown) at the other input terminal. Also, the output terminal of the multiplexer 303 is connected to the clock input terminal CLK of the macro cell 301. Furthermore, the select signal input terminal of the multiplexer 303 is connected to the pad 306. Here, one input terminal of the multiplexer 303 and the pad 308 should be connected during a functional test. During a normal operation, however, the pad 308 may be used as a signal pad for another circuit block (not shown).

The multiplexer 304 is connected to the signal input terminal Q of the macro cell 301 at the first input terminal thereof, and receives the output signal S33 of another circuit block or the like (not shown) at the second input terminal. The third input terminal of the multiplexer 304 is connected to the clock input terminal CLK of the macro cell 301. Also, the output terminal of the multiplexer 304 is connected to the pad 309. Furthermore, one select signal input terminal of the multiplexer 304 is connected to the pad 305 and the other select signal input terminal is connected to the pad 306. The pad 309 may also be used as the output pad for the signal Q and the clock CLK during a functional test and as the output pad for the signal S33 during a normal operation.

In the present embodiment, the signal Q and the clock CLK are both output from the pad 309 through the multiplexer 304. Consequently, the difference between the length of the wiring from the signal output terminal Q to the pad 309 and the length of the wiring from the clock input terminal CLK to the pad 309 becomes the difference between the length of the wiring from the signal output terminal Q to the multiplexer 304 and the length of the wiring from the clock input terminal CLK to the multiplexer 304. Consequently, the multiplexer 304 is disposed at a position such that this difference can be ignored in the wiring delay. For example, it becomes possible to ignore such a wiring delay by disposing the multiplexer 304 in the vicinity of the macro cell 301.

The method for measuring the access time of the semiconductor device shown in FIG. 3 is explained next.

When performing a functional test, the signal TEST supplied to the pad 306 is set to the signal value of the functional test mode. Furthermore, the signal MODE supplied to the pad 305 is set to the signal value for selecting the output terminal Q. In this manner, the multiplexer 302 selects the pad 307, the multiplexer 303 selects the pad 308, and the multiplexer 304 selects the output terminal Q. Subsequently, the test signal TD is input from the pad 307 and the test clock TCLK is input from the pad 308. The test signal TD and test clock TCLK are input through the multiplexers 302 and 303 to the macro cell 301. The macro cell 301 then outputs the signal Q. This signal Q is output through the multiplexer 304 from the pad 309 as the signal TQ. At this time, the required time T3 from when the test clock TCLK is supplied to the pad 308 until the pad 309 outputs the signal is measured.

Next, the signal MODE is changed to the signal value for selecting the clock input terminal CLK. The test clock TCLK is then input from the pad 308. The test clock TCLK is output from the pad 309 through the multiplexers 303 and 304. At this time, the required time T4 from when the test clock TCLK is supplied to the pad 308 until it reaches the pad 309 is measured.

The access time is then calculated by finding the difference between the required times T3–T4.

With the present embodiment, it is therefore possible to calculate the access time after individually measuring the required times T3 and T4 using a single multiplexer. It is also possible to measure the accurate access time of the macro cell with the present embodiment.

Third Embodiment

The third embodiment of the present invention is explained next using FIG. 4. The present embodiment is an example of a semiconductor device for accurately determining the required time for signal output by the macro cell to be taken up by the next stage logic circuit block.

Figure 4:
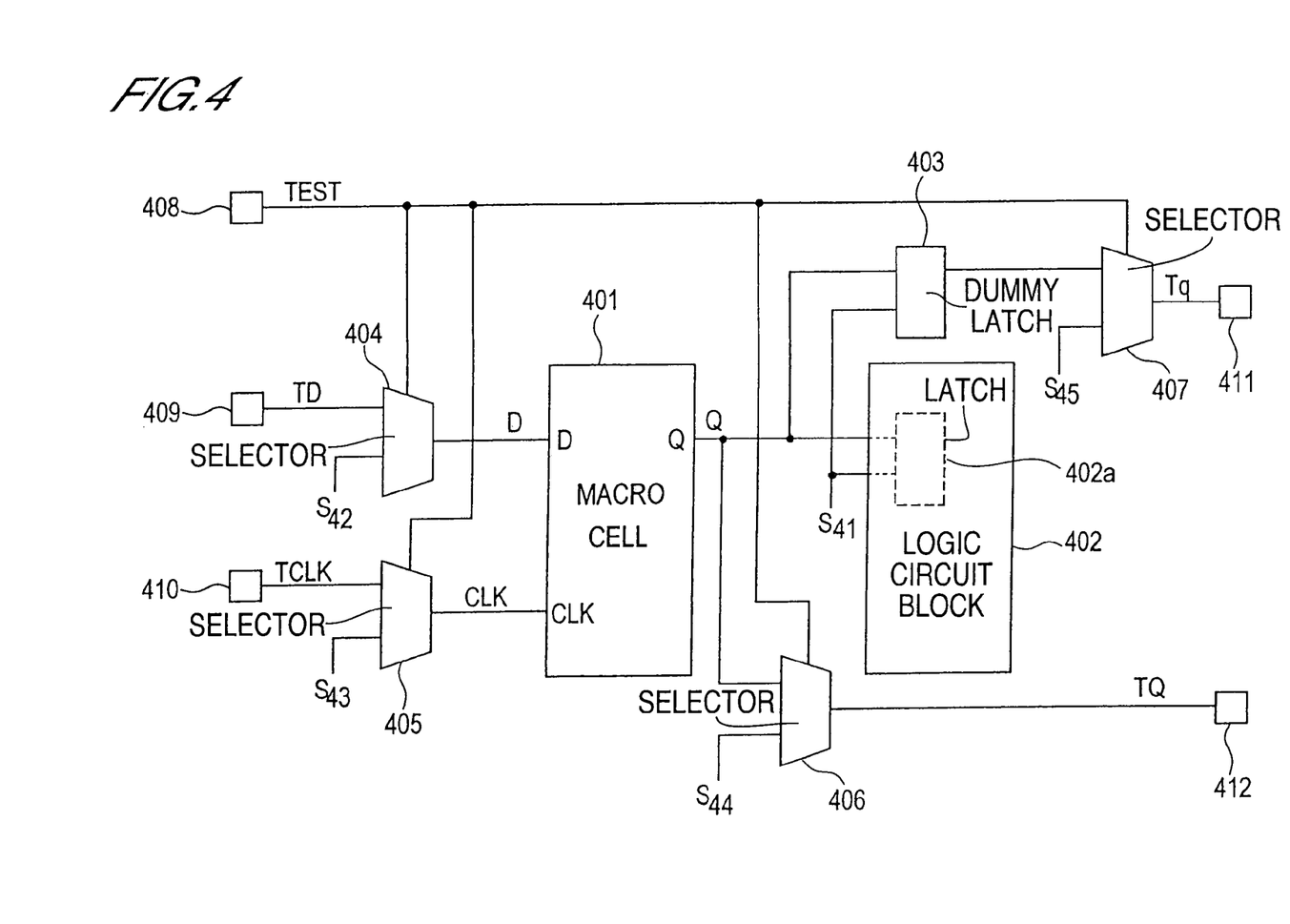
FIG. 4 is a circuit diagram showing the constitution of the semiconductor device relating to a third embodiment.

FIG. 4 is a circuit diagram showing the principal elements constituting the semiconductor device relating to the present embodiment.

As shown in FIG. 4, this semiconductor device comprises a macro cell 401, a logic circuit block 402, a latch 403, multiplexers 404, 405, 406, and 407, input pads 408, 409, 410, and output pads 411 and 412.

The macro cell 401 constitutes RAM or the like and is provided with a signal input terminal D, a clock input terminal CLK, and a signal output terminal Q. The signal D and clock CLK are input to the signal input terminal D and clock input terminal CLK from the multiplexers 404 and 405. Also, the signal output terminal Q outputs the output signal Q to the latch 403, the following logic circuit block 402, and the multiplexer 406.

The logic block 402 comprises a latch 402a as an input circuit. The latch 402a holds the signal Q input from the macro cell 401 at the clock S41. The logic circuit block 402 performs prescribed logic calculations and so forth using the output signal of the latch 402a.

The latch 403 is used as a dummy of the latch 402a. Consequently, a latch with the same access time as the latch 402a is used as the latch 403. This latch 403 holds and outputs the signal Q input from the macro cell 401 at the clock S41.

The multiplexer 404 is connected to the pad 409 at one input terminal thereof, and receives the output signal S42 of another circuit block or the like (not shown) at the other input terminal. Also, the output terminal of the multiplexer 404 is connected to the signal input terminal D of the macro cell 401. Furthermore, the select signal input terminal of the multiplexer 404 is connected to the pad 408. One input terminal of the multiplexer 404 and the pad 409 should be connected during a functional test. Consequently, during a normal operation, the pad 409 may be used as a signal pad for another circuit block (not shown).

The multiplexer 405 is connected to the pad 410 at one input terminal thereof, and receives the clock S43 of another circuit block or the like (not shown) at the other input terminal. Also, the output terminal of the multiplexer 405 is connected to the clock input terminal CLK of the macro cell 401. Furthermore, the select signal input terminal of the multiplexer 405 is connected to the pad 408. One input terminal of the multiplexer 405 and the pad 410 should be connected during a functional test and the pad 410 may be used as a signal pad for another circuit block (not shown) during a normal operation.

The multiplexer 406 is connected to the signal output terminal Q of the macro cell 401 at one input terminal thereof, and receives the output signal S44 of another circuit block or the like (not shown) at the other input terminal. Also, the output terminal of the multiplexer 406 is connected to the pad 412. Furthermore, the select signal input terminal of the multiplexer 406 is connected to the pad 408.

The multiplexer 407 is connected to the signal output terminal of the latch 403 at one input terminal thereof, and receives the output signal S45 of another circuit block or the like (not shown) at the other input terminal. Also, the output terminal of the multiplexer 407 is connected to the pad 411. Furthermore, the select signal input terminal of the multiplexer 407 is connected to the pad 408.

In the present embodiment, the distance from the signal output terminal Q to the latch 402a substantially matches the distance from the signal output terminal Q to the latch 403. For this reason, the latch 403 is established, for example, in the vicinity of the logic circuit block 402.

The method for determining the access time of the semiconductor device shown in FIG. 4 is explained next.

In the case of performing a functional test, the signal TEST supplied to the pad 408 is set at the signal value for the functional test mode. As a result, the multiplexer 404 selects the pad 409, the multiplexer 405 selects the pad 410, the multiplexer 406 selects the signal Q, and the multiplexer 407 selects the output signal of the latch 403. The test signal TD and test clock TCLK are input to the macro cell 401 through the multiplexers 404 and 405. The macro cell 401 then outputs the signal Q. This signal TQ is output from the pad 412 through the multiplexer 406. Also, this signal Q is held in the latch 403. The signal Tq held in the latch 403 is output from the pad 411 through the multiplexer 407.

In this functional test, the signal TQ output by the pad 412 and signal Tq output by the pad 411 are measured, and by verifying whether these match, it can be determined whether the output Q of the macro cell is held by the latch 403 (402a).

In other words, with the present embodiment, it can be accurately determined whether the access time of the macro cell is at a level that causes no problems in the actuation of the subsequent logic circuit block 402.

Fourth Embodiment

The fourth embodiment of the present invention is explained below using FIG. 5. The present embodiment is an example of the semiconductor device for accurately determining the setup time of the macro cell.

Figure 5:
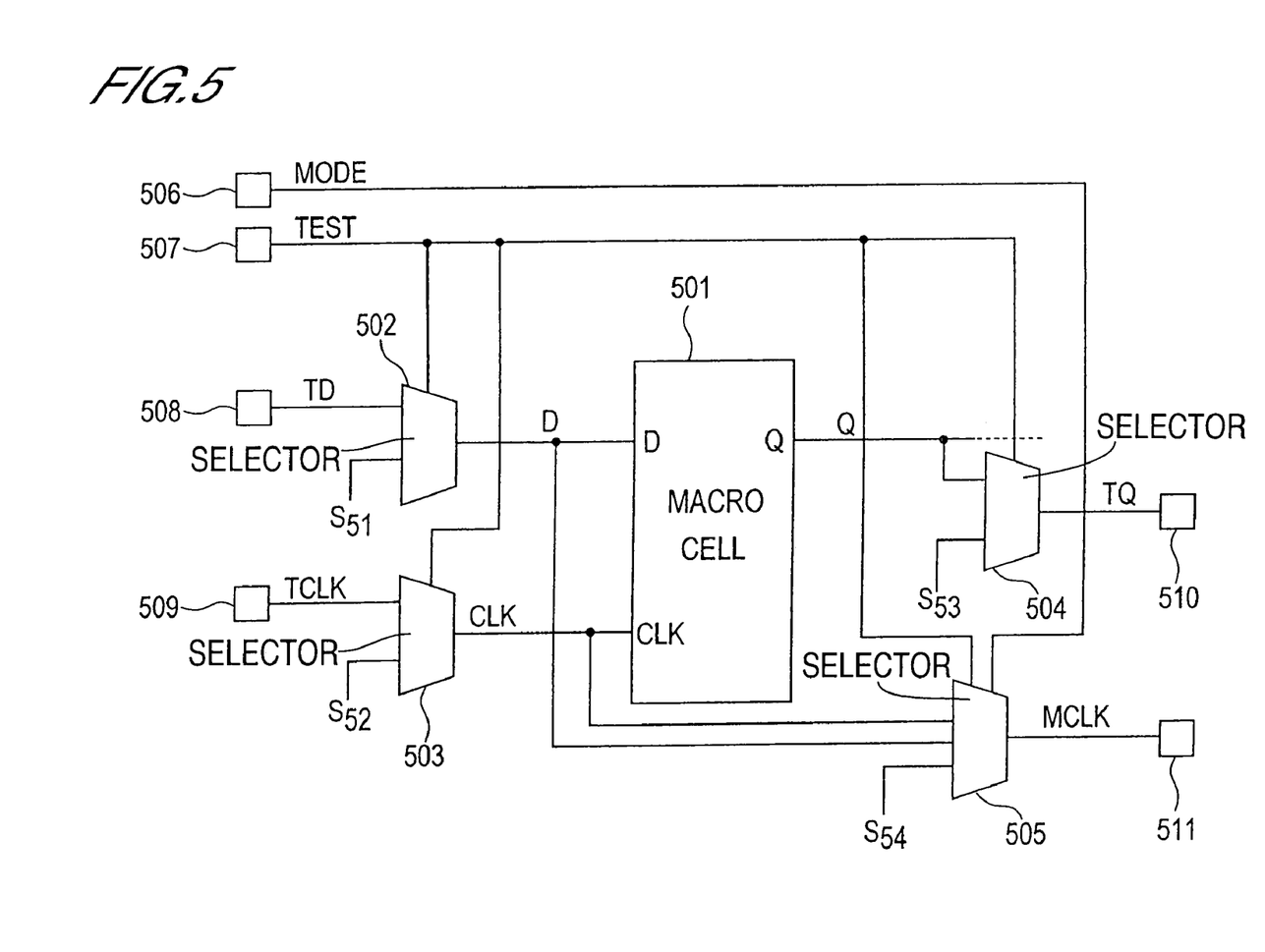
FIG. 5 is a circuit diagram showing the constitution of the semiconductor device relating to a fourth embodiment.

FIG. 5 is a circuit diagram showing the principal elements constituting the semiconductor device relating to the present embodiment.

As shown in FIG. 5, this semiconductor device comprises a macro cell 501, two-input multiplexers 502, 503, 504, a three-input multiplexer 505, input pads 506, 507, 508, 509, and output pads 510, 511.

The macro cell 501 constitutes RAM or the like and is provided with a signal input terminal D, a clock input terminal CLK, and a signal output terminal Q. As discussed below, the signal D and clock CLK are input to the signal input terminal D and clock input terminal CLK from the multiplexers 502 and 503. Also, the signal output terminal Q outputs the output signal Q to a following circuit block, not shown, and the multiplexer 504.

The multiplexer 502 is connected to the pad 508 at one input terminal thereof, and receives the output signal S51 of another circuit block or the like (not shown) at the other input terminal. Also, the output terminal of the multiplexer 502 is connected to the signal input terminal D of the macro cell 501. Furthermore, the select signal input terminal of the multiplexer 502 is connected to the pad 507. One input terminal of the multiplexer 502 and the pad 508 should be connected during a functional test. During a normal operation, however, the pad 508 may be used as a signal pad for another circuit block (not shown).

The multiplexer 503 is connected to the pad 509 at one input terminal thereof, and receives the clock S52 of another circuit block or the like (not shown) at the other input terminal. Also, the output terminal of the multiplexer 503 is connected to the clock input terminal CLK of the macro cell 501. Furthermore, the select signal input terminal of the multiplexer 503 is connected to the pad 507. One input terminal of the multiplexer 503 and the pad 509 should be connected during a functional test. During a normal operation, however, the pad 509 may be used as a signal pad for another circuit block (not shown).

The multiplexer 504 is connected to the signal output terminal Q of the macro cell 501 at one input terminal thereof, and receives the output signal S53 of another circuit block or the like (not shown) at the other input terminal. Also, the output terminal of the multiplexer 504 is connected to the pad 510. Furthermore, the select signal input terminal of the multiplexer 504 is connected to the pad 507. Accordingly, the pad 510 is used as the output pad of the signal Q during a functional test and as the output pad of the signal S53 during a normal operation.

The multiplexer 505 is connected to the signal input terminal D of the macro cell 501 at the first input terminal thereof, is connected to the clock input terminal CLK of the macro cell 501 at the second input terminal, and receives the output signal S54 of another circuit block or the like (not shown)at the third input terminal. Also, the output terminal of the multiplexer 505 is connected to the pad 511. Furthermore, one select signal input terminal of the multiplexer 505 is connected to the pad 506; the other select signal input terminal is connected to the pad 507. Accordingly, the pad 511 may be used as the output pad for the signal D and the clock CLK during a functional test and as the output pad for the signal S54 during a normal operation.

In the present environment, the difference between the wiring delay of the signal output from the multiplexer 503 and reaching the multiplexer 505 and the wiring delay of the signal output from the multiplexer 502 and reaching the multiplexer 505 is made ignorable. For this reason, the multiplexer 503, for example, is arranged in the vicinity of the multiplexer 502.

An example of the method for testing the setup time of the semiconductor device shown in FIG. 5 is explained next.

When performing a functional test, the signal TEST supplied to the pad 507 is set at a signal value for the functional test mode. Furthermore, the signal MODE supplied to the pad 506 is set at a signal value for selecting the signal input terminal D. As a result, the multiplexer 502 selects the pad 508, the multiplexer 503 selects the pad 509, the multiplexer 504 selects the signal Q, and the multiplexer 505 selects the signal input terminal D. The test signal TD is then input from the pad 508 and the test clock TCLK is input from the pad 509. At this time, after a prescribed period of time t1 from when the test signal TD is applied to the pad 508, the test clock TCLK rises and then after a prescribed period of time t2 from this rise time, the application of the test signal TD ends. These signals TD and TCLK are applied to the macro cell 501 through the multiplexers 502 and 503. The macro cell 501 receives the test signal TD at the rise time of the test clock TCLK and outputs the signal Q of a value corresponding to the value of this signal TD. This signal TQ is output from the pad 510 through the multiplexer 504. Also, the signal TD is output from the pad 511 through the multiplexer 505. At this time, the required time T7, from when the test signal TD is supplied to the pad 508 until the pad 511 outputs the signal TD, is measured.

Next, the signal MODE is converted to the signal value for selecting the clock input terminal CLK. At this time, the test clock TCLK is input from the pad 509. The test clock TCLK is output from the pad 511 through the multiplexers 503 and 505. The required time T8 from when the test clock TCLK is supplied to the pad 509 until the pad 511 outputs the test clock TCLK is measured.

Afterwards, the difference between the required times T7–T8 is calculated. This time difference T7–T8 is equal to the difference between the wiring delay of the path from the pad 508 to the signal input terminal D and the wiring delay of the path from the pad 509 to the clock input terminal CLK. Next, the time difference T7–T8 is added to the prescribed times τ1 and τ2 discussed above. Of the sums thus obtained, τ1+(T7–T8) is the actual time from when the test signal TD is applied to the macro cell 501 until the test clock TCLK is applied to the macro cell 501. Also, τ2+(T7–T8) is the actual time from when the test clock TCLK is applied to the macro cell 501 until the application of the test signal TD ends.

In this way, the present embodiment makes it possible to test the setup time accurately.

As explained in detail above, the semiconductor device relating to the present invention can perform accurate a functional test and eliminate the influence of the wiring delay.

What is claimed is:

1. A semiconductor device having an access time measuring test mode, comprising:

a circuit block to which an input signal is input at a timing in accordance with an input clock, and which outputs an output signal having a value corresponding to said input signal;

a first signal path for guiding a test input signal, which has been supplied to a first pad, from said first pad to a signal input terminal of said circuit block;

a second signal path for guiding a test clock, which has been supplied to a second pad, from said second pad to a clock input terminal of said circuit block;

a third signal path for guiding a test output signal, which has been output from a signal output terminal of said circuit block, from said signal output terminal to a third pad; and a fourth signal path for guiding said test clock, which is input to said clock input terminal, from said clock input terminal to a fourth pad, wherein said third and fourth signal paths are formed so that wiring delay time of said third and fourth signal paths are substantially equal, wherein said fourth signal path has provided therein a first selector, responsive to a mode of a selection signal, that selectively supplies a prescribed signal or said test clock directly to said fourth pad, a first wiring that directly connects said clock input terminal of said circuit block to an input terminal of said first selector, and a second wiring that directly connects an output terminal of said first selector to said fourth pad, wherein said third signal path has provided therein a second selector which during a normal operation supplies a second prescribed signal other than said test output signal to said third pad and which during a test operation supplies said test output signal to said third pad, a third wiring that directly connects said signal output terminal of said circuit block to an input terminal of said second selector, and a fourth wiring that directly connects an output terminal of said second selector to said third pad, and wherein said third and fourth signal paths are provided so that a difference of timings from when said test clock is output at said fourth pad to when said test output signal is output at said third pad is indicative of an access time of said circuit block.

2. The semiconductor device according to claim 1, wherein said first signal path has provided therein a third selector which during the normal operation supplies an output signal from a preceding circuit block to said signal input terminal of said circuit block, and which during the test operation supplies said test input signal to said signal input terminal of said circuit block.

3. The semiconductor device according to claim 1, wherein said second signal path has provided therein a third selector which during the normal operation supplies a normal clock to said clock input terminal of said circuit block, and which during the test operation supplies said test clock to said clock input terminal of said circuit block.

4. The semiconductor device according to claim 1, wherein the wiring delay time of said third and fourth signal paths are set to be substantially equal whereby a sum of lengths of said first and second wirings is set to be substantially the same as a sum of lengths of said third and fourth wirings.

* * * * *